(12) United States Patent
Lee et al.

(10) Patent No.: US 9,865,516 B2
(45) Date of Patent: Jan. 9, 2018

(54) WAFERS HAVING A DIE REGION AND A SCRIBE-LINE REGION ADJACENT TO THE DIE REGION

(71) Applicant: Micron Technology, Inc., Boise, ID (US)

(72) Inventors: Tzung-Han Lee, Taipei (TW); Chun-Yi Wu, New Taipei (TW); Sheng-Yu Yan, New Taipei (TW); Yi-Ting Cheng, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/992,013

(22) Filed: Jan. 10, 2016

(65) Prior Publication Data

US 2017/0200661 A1  Jul. 13, 2017

(51) Int. Cl.

| H01L 21/66 | (2006.01) |
|---|---|
| H01L 23/528 | (2006.01) |
| H01L 23/00 | (2006.01) |
| H01L 21/768 | (2006.01) |
| H01L 23/522 | (2006.01) |

(52) U.S. Cl.
CPC .......... *H01L 22/32* (2013.01); *H01L 21/7685* (2013.01); *H01L 21/76892* (2013.01); *H01L 23/528* (2013.01); *H01L 23/5226* (2013.01); *H01L 24/03* (2013.01); *H01L 24/05* (2013.01); *H01L 2224/05005* (2013.01); *H01L 2224/06102* (2013.01); *H01L 2924/2064* (2013.01)

(58) Field of Classification Search
CPC ......... H01L 22/30; H01L 22/32; H01L 22/34; H01L 23/528; H01L 24/05; H01L 24/03; H01L 21/7685; H01L 23/5226; H01L 21/76892
See application file for complete search history.

(56) References Cited

U.S. PATENT DOCUMENTS

| 7,592,710 | B2 | 9/2009 | Hsia et al. | |
|---|---|---|---|---|
| 2003/0153172 | A1* | 8/2003 | Yajima | H01L 22/34 438/612 |
| 2005/0230005 | A1* | 10/2005 | Liang | H01L 23/5226 148/33.3 |
| 2012/0168752 | A1* | 7/2012 | Wu | H01L 22/34 257/48 |

(Continued)

FOREIGN PATENT DOCUMENTS

| TW | 200605188 | | 2/2006 |
|---|---|---|---|
| TW | 201101380 A | * | 1/2011 |

(Continued)

OTHER PUBLICATIONS

Rejection Decision from Taiwanese Application No. 105113857, dated Jul. 20, 2017, 22 pages.

*Primary Examiner* — Steven Loke
*Assistant Examiner* — Juanita Rhodes
(74) *Attorney, Agent, or Firm* — TraskBritt (57) ABSTRACT

A wafer and a forming method thereof are provided. The wafer has a die region and a scribe-line region adjacent to the die region, and includes a conductive bonding pad in the die region of the wafer and a wafer acceptance test (WAT) pad in the scribe-line region of the wafer. A top surface of the WAT pad is lower than a top surface of the conductive bonding pad.

19 Claims, 6 Drawing Sheets

(56) References Cited

U.S. PATENT DOCUMENTS

| | | | | |
|---|---|---|---|---|
| 2014/0035146 A1* | 2/2014 | Kim | ............... | H01L 23/485 |
| | | | | 257/760 |
| 2014/0070226 A1* | 3/2014 | Alvarez | ............. | H01L 24/03 |
| | | | | 257/76 |
| 2014/0232001 A1* | 8/2014 | Gratz | ............... | H01L 21/768 |
| | | | | 257/762 |

FOREIGN PATENT DOCUMENTS

| | | |
|---|---|---|
| TW | 201101380 A1 | 1/2011 |
| TW | 201417230 A | 5/2014 |

\* cited by examiner

WAFERS HAVING A DIE REGION AND A SCRIBE-LINE REGION ADJACENT TO THE DIE REGION

BACKGROUND

In order to ensure the quality and stability of the wafer, a wafer acceptance test (WAT) of the wafer is necessary. WAT test is an electrical test for a test structure on the wafer after completing the manufacturing process of the wafer. Based on WAT data analysis, it can effectively detect the problems of the semiconductor process technology to facilitate the adjustment and optimization of process technology.

Dicing is performed on wafer after the WAT test. The technology of dicing has been developed to a high standard. One restriction of dicing is the resulting cracks extending laterally from the dicing line into the semiconductor and insulating materials. Following these cracks, moisture and contamination are free to penetrate active circuitry and will start degrading the electrical device performance. Even today, this generation of cracks is the most significant limitation with respect to minimizing circuit chips. In addition, the cracks also represent significant reliability risks, since they tend to grow and widen under thermal and mechanical stress and thus eventually imperil the functionality of the integrated circuit.

Accordingly, it is essential to improve the crack problem of the wafer after the dicing process.

BRIEF SUMMARY

The present disclosure provides a wafer having a die region and a scribe-line region adjacent to the die region. The wafer includes a conductive bonding pad in the die region of the wafer and a wafer acceptance test (WAT) pad in the scribe-line region of the wafer. A top surface of the WAT pad is lower than a top surface of the conductive bonding pad.

In various embodiments of the present disclosure, the WAT pad has a bottom portion and a side portion surrounding the bottom portion, and the top surface of the WAT pad is an upper surface of the bottom portion of the WAT pad.

In various embodiments of the present disclosure, the side portion has a top surface at a same horizontal level with a top surface of the conductive bonding pad.

In various embodiments of the present disclosure, the side portion of the WAT pad includes an upper portion and a lower portion, and a width of the upper portion is greater than a width of the lower portion.

In various embodiments of the present disclosure, the upper portion of the side portion has a height the same as a height of the conductive bonding pad.

In various embodiments of the present disclosure, the height of the conductive bonding pad is in a range from 3 μm to 10 μm.

In various embodiments of the present disclosure, the wafer has a test key in the scribe-line region, and the WAT pad is located at the test key in the scribe-line region of the wafer.

In various embodiments of the present disclosure, the wafer further includes an interconnect layer under the conductive bonding pad in the die region.

In various embodiments of the present disclosure, the interconnect layer includes a metal layer, an intermetal dielectric (IMD) layer and a via.

In various embodiments of the present disclosure, the interconnect layer in the die region has a height in a range from 5 μm to 10 μm.

In various embodiments of the present disclosure, the wafer further includes a first barrier layer between the interconnect layer and the conductive bonding pad.

In various embodiments of the present disclosure, the wafer further includes a second barrier layer surrounding the WAT pad.

The present disclosure provides a method of forming a wafer, and the method includes following steps. An interconnect layer is formed over a semiconductor substrate, and the semiconductor substrate has a die region and a scribe-line region adjacent to the die region. The interconnect layer in the scribe-line region is etched to form a recess in the interconnect layer of the scribe-line region. A conductive bonding pad is formed over the interconnect layer in the die region. A WAT pad is formed in the recess of the scribe-line region, and a top surface of the WAT pad is lower than a top surface of the conductive bonding pad.

In various embodiments of the present disclosure, the process of forming the conductive bonding pad over the interconnect layer in the die region includes the following steps. A metal layer is formed over the interconnect layer in the die region. A portion of metal layer in the die region is removed to form the conductive bonding pad.

In various embodiments of the present disclosure, the process of forming a WAT pad in the recess of the scribe-line region includes following steps. A metal layer is formed in the recess of the scribe-line region. A portion of the metal layer in the recess of the scribe-line region is removed to form the WAT pad in the recess.

In various embodiments of the present disclosure, the method further includes that a first barrier layer is formed over the interconnect layer before forming the conductive bonding pad in the die region.

In various embodiments of the present disclosure, the method further includes that a second barrier layer is formed in the recess before forming the WAT pad in the recess of the scribe-line region.

In various embodiments of the present disclosure, the interconnect layer includes a metal layer, an intermetal dielectric (IMD) layer and a via.

The present disclosure provides another method of forming a wafer, and the method includes following steps. An interconnect layer is formed over a semiconductor substrate, and the semiconductor substrate has a die region and a scribe-line region adjacent to the die region. The interconnect layer in the scribe-line region is etched to form a recess in the interconnect layer of the scribe-line region. A metal layer is conformally formed over the interconnect layer of the die region and in the recess of the scribe-line region, and the metal layer in the recess is acted as a WAT pad. A portion of the metal layer in the die region is removed to form a conductive bonding pad.

In various embodiments of the present disclosure, the method of forming the wafer further includes removing a portion of the WAT pad in the recess of the scribe-line region after conformally forming the metal layer over the interconnect layer of the die region and in the recess of the scribe-line region.

These and other features, aspects, and advantages of the present disclosure will become better understood with reference to the following description and appended claims.

It is to be understood that both the foregoing general description and the following detailed description are examples, and are intended to provide further explanation of the invention as claimed

BRIEF DESCRIPTION OF THE DRAWINGS

The disclosure could be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

As aforementioned problems, the generation of cracks during the dicing process is a crucial problem to affect the yield of the integrated circuit (IC). Accordingly, an improved structure of a wafer and a forming method thereof are required.

Figure 1:
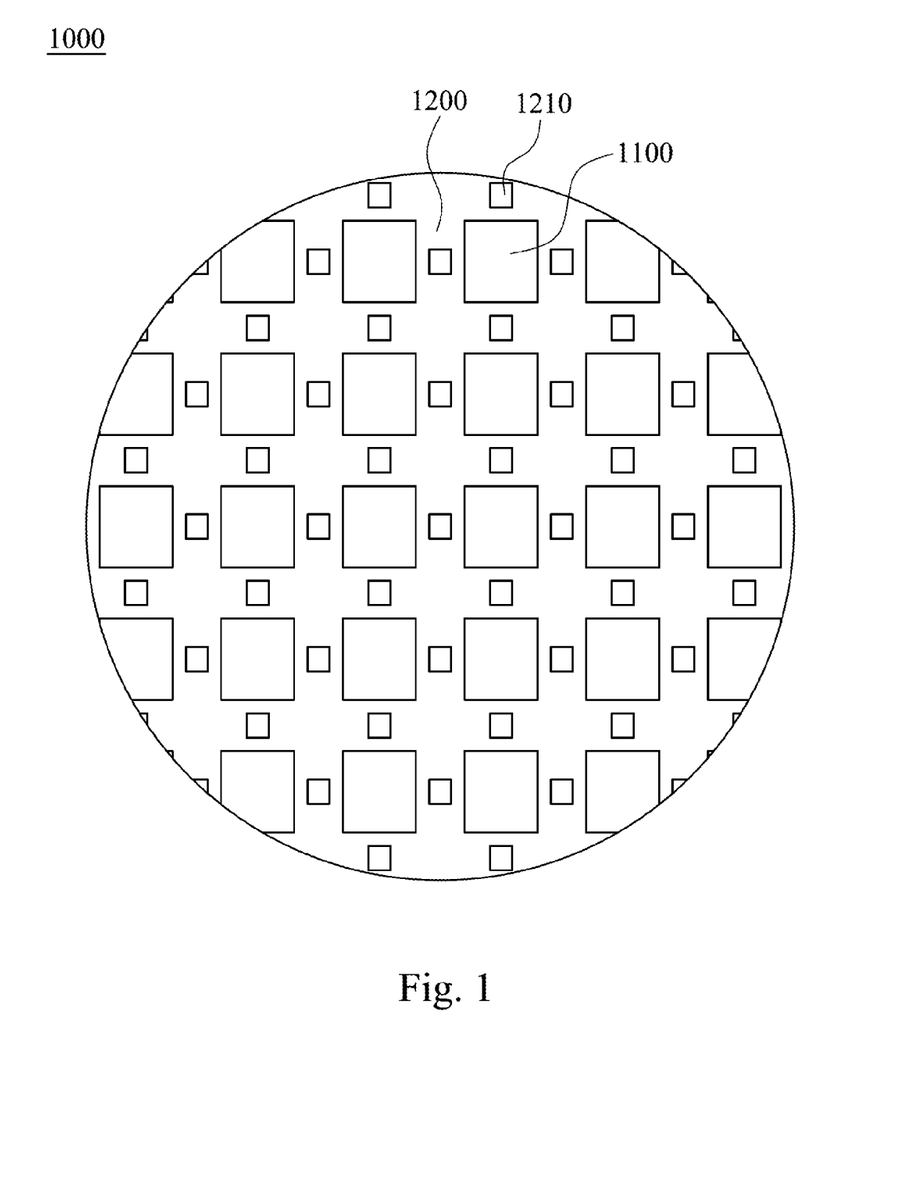
FIG. 1 is a top view of a wafer having a die region and a scribe-line region adjacent to the die region according to various embodiments of the present disclosure.

The present disclosure provides a wafer and a forming method thereof. FIG. 1 is a top view of a wafer 1000 according to various embodiments of the present disclosure. The wafer 1000 of the present disclosure has a die region 1100 and a scribe-line region 1200 adjacent to the die region 1100. In details, the wafer 1000 has many repeat die regions 1100 thereon, and each two of die regions 1100 are separated by a scribe-line region 1200. The dicing process is performed on the scribe-line region 1200 to evenly divide the wafer 1000 into many single dies, which have an integrated circuit.

Figure 2A:
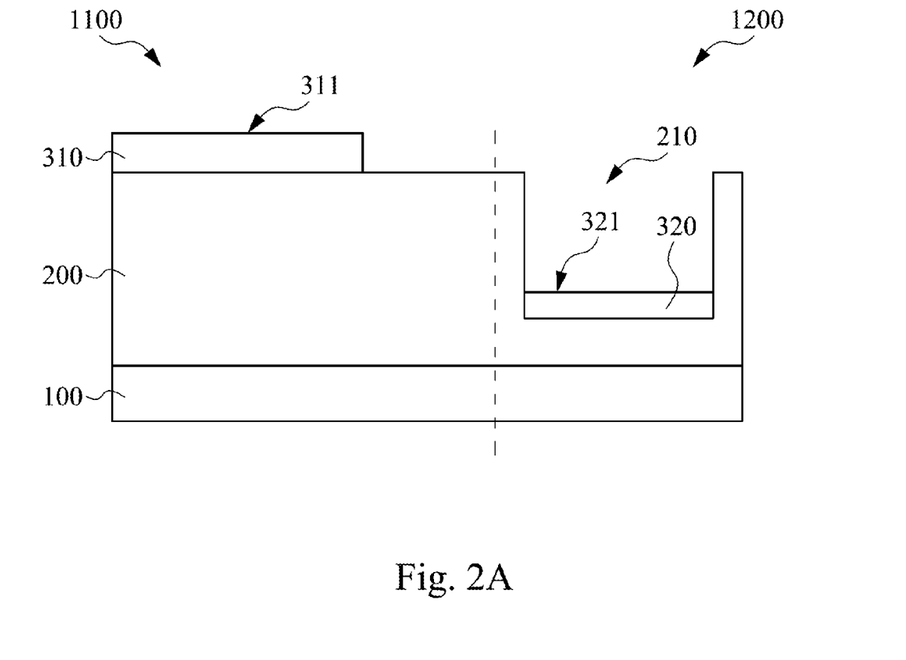
FIG. 2A is a cross-sectional side view of a wafer according to various embodiments of the present disclosure.

FIG. 2A is a cross-sectional side view of a wafer according to various embodiments of the present disclosure. Specifically, FIG. 2A is a cross-sectional side view of a part of the wafer having a die region 1100 on the left of the dashed line and a scribe-line region 1200 on the right of the dashed line. The wafer includes a conductive bonding pad 310 in the die region 1100 and a wafer acceptance test (WAT) pad 320 in the scribe-line region 1200, and a top surface 321 of the WAT pad 320 is lower than a top surface 311 of the conductive bonding pad 310.

Referring to FIGS. 1 and 2A, the wafer 1000 has a test key 1210 in the scribe-line region 1200, and the WAT pad 320 is located at the test key 1210 in the scribe-line region 1200 of the wafer 1000. The arrangement of test key 1210 in the scribe-line region 1200 of the wafer 1000 is only exemplary, but not intended to limit the present disclosure.

Still referring to FIG. 2A. In some embodiments, the wafer includes a semiconductor substrate 100, an interconnect layer 200, at least a conductive bonding pad 310 and at least a WAT pad 320. Specifically, the interconnect layer 200 is over the semiconductor substrate 100 and has a recess 210 in the scribe-line region 1200. The conductive bonding pad 310 is over the interconnect layer 200 of the die region 1100 and the WAT pad 320 is in the recess 210 of the interconnect layer 200 of the scribe-line region 1200. One should note that some of the structures have been omitted for the purpose of simplicity and clarity. Furthermore, the height of the conductive bonding pad 310 in the die region 1100 may be in a range from 3 µm to 10 µm, particularly from 4.5 µm to 5.5 µm. The height of the interconnect layer 200 in the die region 1100 may be in a range from 5 µm to 10 µm, particularly 6 µm.

In some embodiments, the interconnect layer 200 includes at least a metal layer, at least an intermetal dielectric (IMD) layer and at least a via. Further, the arrangement of the metal layer, the IMD layer and the via can be arranged in accordance with the actual needs.

In accordance with some embodiments, a semiconductor substrate 100 may include passive components such as resistors, capacitors, inductors, and active components such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof (not shown). It is further understood that additional features may be added in the semiconductor substrate 100 for additional embodiments.

Figure 2B:
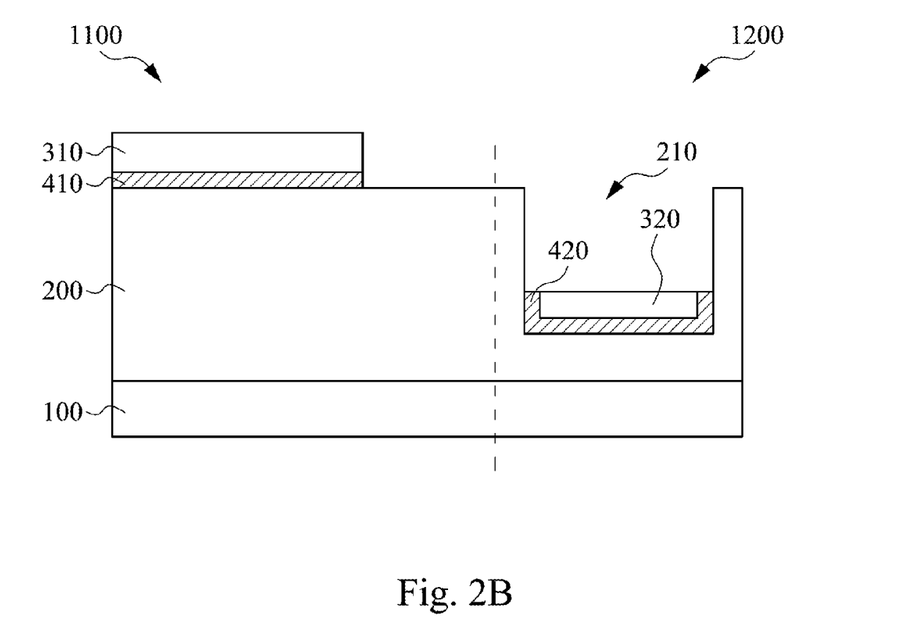
FIG. 2B is a cross-sectional side view of a wafer according to various embodiments of the present disclosure.

FIG. 2B is a cross-sectional side view of a partial of the wafer according to various embodiments of the present disclosure. The wafer in FIG. 2B further includes a first barrier layer 410 and a second barrier layer 420. Specifically, the first barrier layer 410 is between the interconnect layer 200 and the conductive bonding pad 310 in the die region 1100, and the second barrier layer 420 surrounds the WAT pad 320 in the scribe-line region 1200. For example, the second barrier layer 420 may be between the interconnect layer 200 and the WAT pad 320 in the scribe-line region 1200.

In further detail, the first barrier layer 410 and the second barrier layer 420 may be made of any suitable material. Examples of the material include but not limited to TiN, TaN, AlN, TiC, TaC, AlC or a combination thereof. Other details in FIG. 2B may refer to the descriptions of the counterparts in FIG. 2A, and hence are not repeated herein.

Figure 3A:
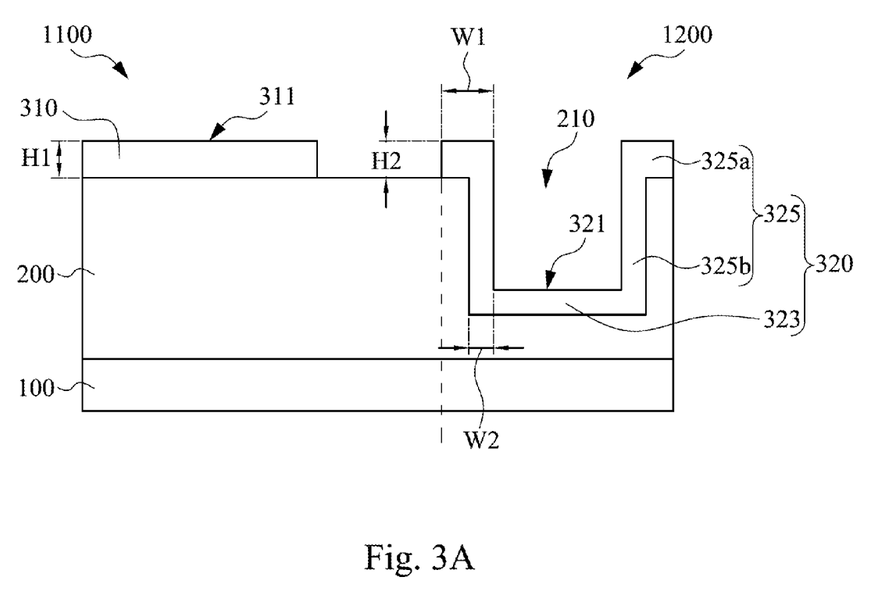
FIG. 3A is a cross-sectional side view of a wafer according to various embodiments of the present disclosure.

FIG. 3A is a cross-sectional side view of a wafer according to various embodiments of the present disclosure. Specifically, FIG. 3A is a cross-sectional view of a partial of the wafer having a die region 1100 on the left of the dotted line and a scribe-line region 1200 on the right of the dotted line.

In some embodiments, the wafer includes a semiconductor substrate 100, an interconnect layer 200, at least a conductive bonding pad 310 and at least a WAT pad 320.

Specifically, the interconnect layer 200 is over the semiconductor substrate 100, and has a recess 210 in the scribe-line region 1200. The conductive bonding pad 310 is over the interconnect layer 200 of the die region 1100, and the WAT pad 320 is in the recess 210 of the interconnect layer 200 of the scribe-line region 1200. One should note that some of the structures have been omitted for the purpose of simplicity and clarity.

In details, the WAT pad 320 has a bottom portion 323 and a side portion 325 surrounding the bottom portion 323, and the top surface 321 of the WAT pad 320 is an upper surface of the bottom portion 323 of the WAT pad 320. More particularly, the upper surface of the bottom portion 323 of the WAT pad 320 is lower than the top surface 311 of the conductive bonding pad 310.

In some embodiments, the side portion 325 of the WAT pad 320 has a top surface at a same horizontal level with a top surface 311 of the conductive bonding pad 310. Further, the side portion 325 of the WAT pad 320 may include an upper portion 325a and a lower portion 325b, and a width W1 of the upper portion 325a is greater than a width W2 of the lower portion 325b.

In addition, the upper portion 325a of the side portion 325 has a height H2 the same as a height H1 of the conductive bonding pad 310 according to some embodiments. The height H2 of the upper portion 325a of the side portion 325 and the height H1 of the conductive bonding pad 310 are both in a range from 3 µm to 10 µm, particularly from 4.5 µm to 5.5 µm. Other details in FIG. 3A may refer to the descriptions of the counterparts in FIG. 2A, and hence are not repeated herein.

Figure 3B:
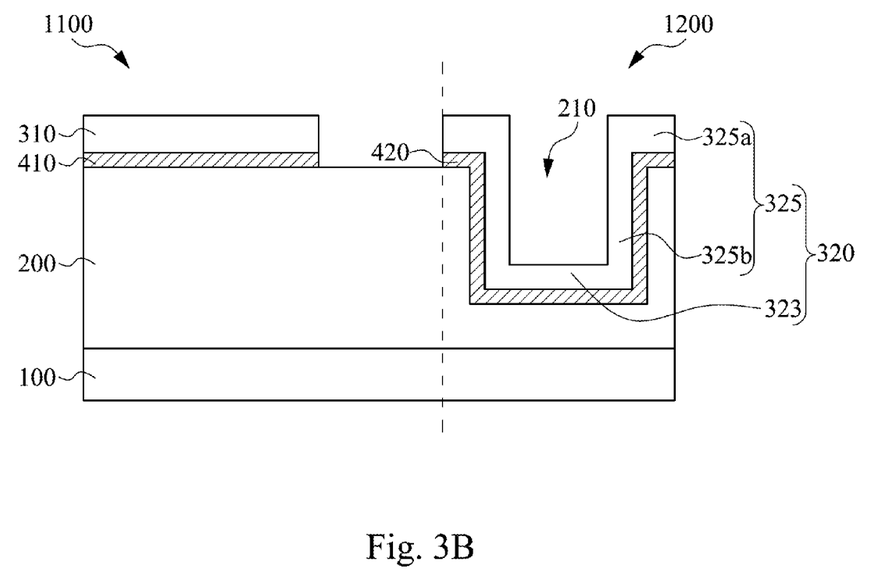
FIG. 3B is a cross-sectional side view of a wafer according to various embodiments of the present disclosure.

FIG. 3B is a cross-sectional side view of a partial wafer according to various embodiments of the present disclosure. The wafer in FIG. 3B further includes a first barrier layer 410 and a second barrier layer 420. Specifically, the first barrier layer 410 is between the interconnect layer 200 and the conductive bonding pad 310 in the die region 1100, and the second barrier layer 420 surrounds the WAT pad 320 in the scribe-line region 1200. For example, the second barrier layer 420 may be between the interconnect layer 200 and the WAT pad 320 in the scribe-line region 1200. Other details in FIG. 3B may refer to the descriptions of the counterparts in FIGS. 2A through 3A, and hence are not repeated herein.

Since the top surface 321 of the WAT pad 320 in the scribe-line region 1200 is lower than the top surface 311 of the conductive bonding pad 310 in the die region 1100, as shown in FIGS. 2A through 3B, the possibility of the generation of cracks caused by the dicing process on the WAT pad 320 of the scribe-line region 1200 can be decreased, and, hence, it can decrease the phenomenon of cracks extending laterally from the dicing line of the scribe-line region 1200 into the die region 1100 and further avoid moisture and contamination penetrating the integrated circuit in the die region 1100. Therefore, the improved structure of the wafer in the present disclosure can solve the crack problem during the dicing process and maintain the electrical device performance. In addition, the conductive bonding pad of the present disclosure can be directly wired, so that the size of die can be decreased.

The present disclosure provides a method of forming a wafer, and the method includes the following steps as shown in FIGS. 4 through 7 according to some embodiments.

FIGS. 4 through 7 are cross-sectional side views of intermediate stages during the forming of a wafer according to various embodiments of the present disclosure.

Figure 4:
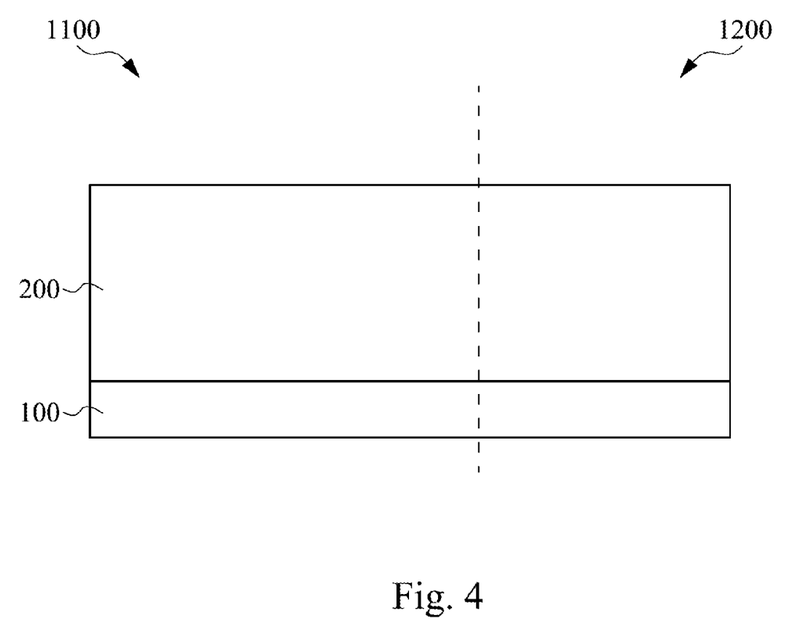
FIGS. 4 through 7 are cross-sectional side views of intermediate stages during the forming of a wafer according to various embodiments of the present disclosure.

First, refer to FIG. 4. As shown in FIG. 4, an interconnect layer 200 is formed over a semiconductor substrate 100, and the semiconductor substrate 100 has a die region 1100 and a scribe-line region 1200 adjacent to the die region 1100. In details, the die region 1100 is on the left of the dotted line and the scribe-line region 1200 is on the right of the dotted line as shown in FIG. 4.

Figure 5:
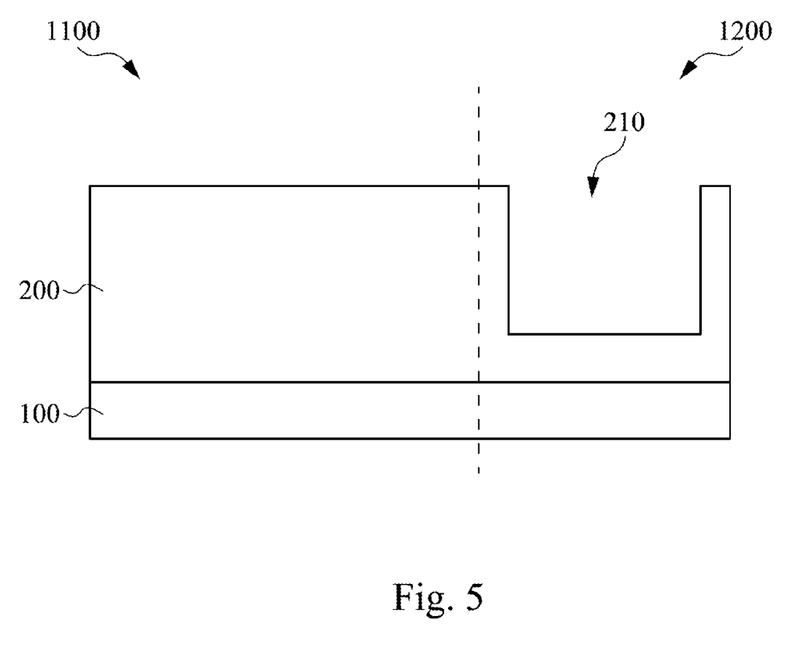

Next, refer to FIG. 5. As shown in FIG. 5, the interconnect layer 200 in the scribe-line region 1200 is etched to form a recess 210 in the interconnect layer 200 of the scribe-line region 1200.

Figure 6A:
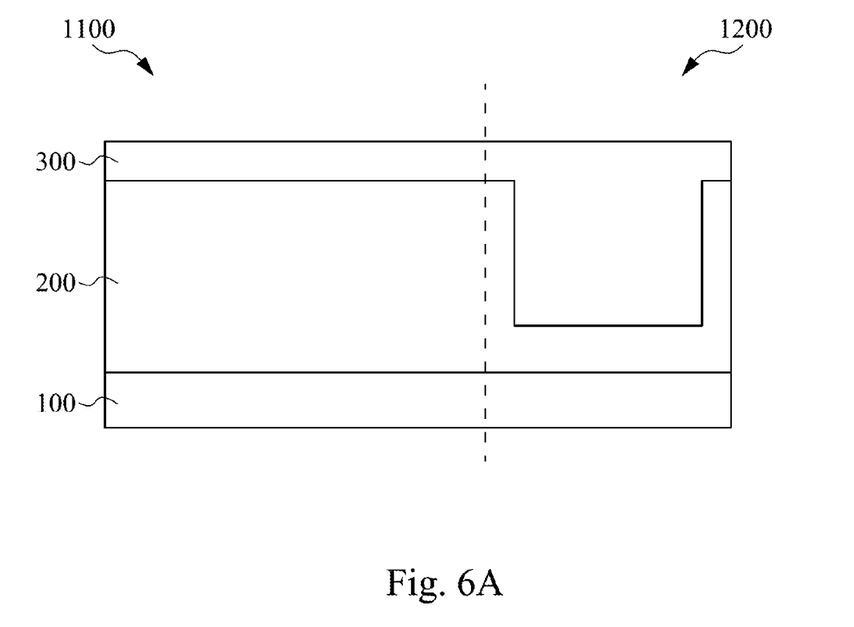
Figure 6B:
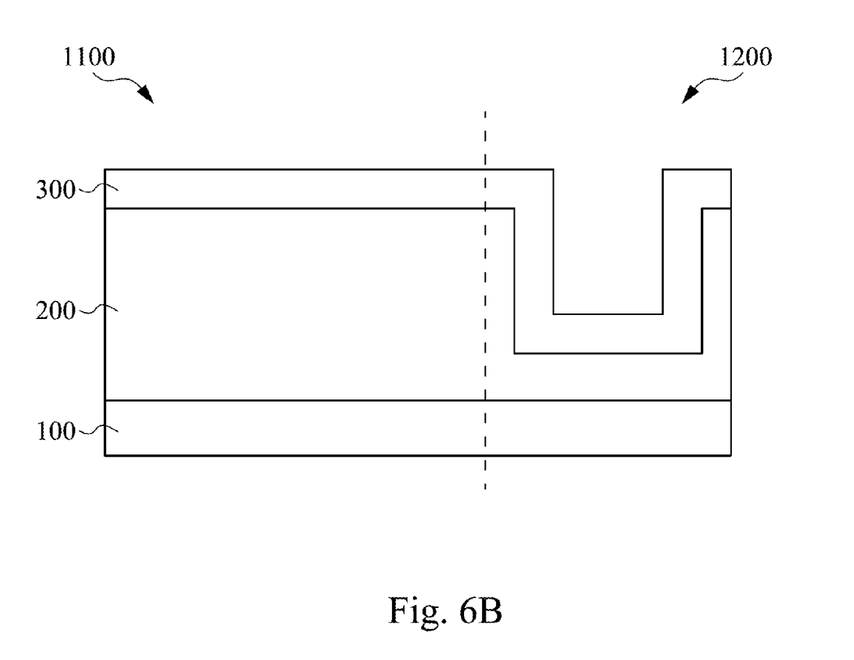

FIGS. 6A and 6B illustrate two ways of forming a metal layer 300 over the interconnect layer 200. As shown in FIG. 6A, the metal layer 300 is formed over the interconnect layer 200 of the die region 1100 and the scribe-line region 1200, and filled in the recess 210 of the interconnect layer 200 of the scribe-line region 1200. Specifically, the metal layer 300 of the die region 1100 and the metal layer 300 of the scribe-line region 1200 have the same horizontal upper surface.

As shown in FIG. 6B, the metal layer 300 is conformally formed over the interconnect layer 200 in the die region 1100 and the scribe-line region 1200. In some embodiments, the metal layer 300 conformally covers the recess 210 (in FIG. 5) of the interconnect layer 200 in the scribe-line region 1200.

Figure 7:
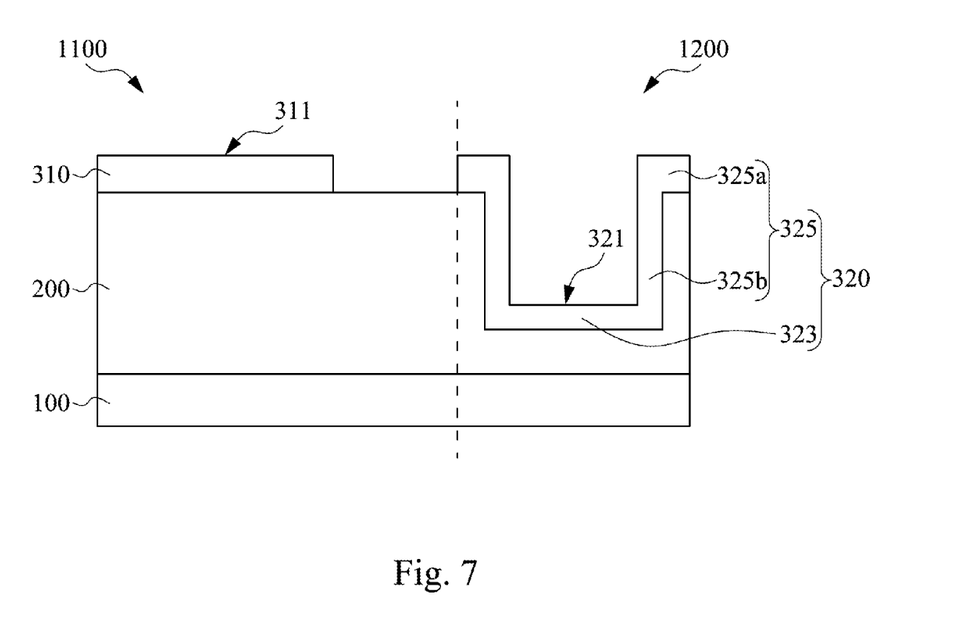

Referring to FIGS. 6A and 7, a portion of metal layer 300 in the die region is removed to expose a partial surface of the interconnect layer 200 under the metal layer 300, and the remaining portion of the metal layer 300 is acted as a conductive bonding pad 310 shown in FIG. 7. In addition, a portion of the metal layer 300 in the recess 210 (in FIG. 5) of the scribe-line region 1200 is removed to form the WAT pad conformally covering the recess 210 (in FIG. 5) of the scribe-line region 1200.

Specifically, the WAT pad 320 may have a bottom portion 323 and a side portion 325 surrounding the bottom portion 323 as shown in FIG. 7. Further, the side portion 325 of the WAT pad 320 may have an upper portion 325a and a lower portion 325b. In accordance with some embodiments, the thickness of the bottom portion 323 and the lower portion 325b of the side portion 325 is less than the thickness of the upper portion 325a of the side portion 325 as shown in FIG. 7. It is noted that the top surface 321 of the bottom portion 323 of the WAT pad 320 is lower than the top surface 311 of the conductive bonding pad 310 as shown in FIG. 7.

Please refer to FIGS. 6B and 7. As shown in FIG. 6B, the metal layer 300, conformally formed over the recess 210 (in FIG. 5) of the scribe-line region 1200, is acting as a WAT pad. In addition, a portion of the metal layer 300 (in FIG. 6B) in the die region 1100 may be removed to expose a partial surface of the interconnect layer 200 under the metal layer 300, and the remaining portion of the metal layer 300 is acting as a conductive bonding pad 310 shown in FIG. 7. The top surface 321 of the bottom portion 323 of the WAT pad 320 is lower than the top surface 311 of the conductive bonding pad 310 as shown in FIG. 7.

In some embodiments, the method of forming the WAT pad 320 further includes removing a portion of the WAT pad in the recess of the scribe-line region, so that the thickness of the bottom portion 323 and the lower portion 325b of the side portion 325 is less than the thickness of the upper portion 325a of the side portion 325 as shown in FIG. 7.

In some embodiments, the method of forming the wafer further includes forming a barrier layer (not shown) over the interconnect layer in the die region and the scribe-line region before forming the metal layer 300 (in FIGS. 6A and 6B).

The removing method stated above may include etching or other suitable process, and the etching process includes dry etching and wet etching. In addition, the forming methods of the interconnect layer, the metal layer and the barrier layer may include chemical vapor deposition (CVD), physical vapor deposition (PVD), plating, atomic layer deposition (ALD) or other suitable techniques. One person skilled in the art will select the method in accordance with the actual needs.

The embodiments of the present disclosure discussed above have advantages over existing wafer and the forming method thereof, and the advantages are summarized below. Because the top surface 321 of the WAT pad 320 in the scribe-line region 1200 is lower than the top surface 311 of the conductive bonding pad 310 in the die region 1100 as shown in FIGS. 2A through 3B, the possibility of the generation of cracks caused by the dicing process on the WAT pad 320 of the scribe-line region 1200 can be decreased, and hence it can decrease the phenomenon of cracks extending laterally from the dicing line of the scribe-line region into the die region and further avoid moisture and contamination penetrating the integrated circuit in the die region. Therefore, the improved structure of the wafer in the present disclosure can solve the crack problem during the dicing process and maintain the electrical device performance. In addition, the conductive bonding pad of the present disclosure can be directly wired, so that the size of the die can be decreased. To summarize the above points, the wafer of the present disclosure can avoid imperiling the functionality of the integrated circuit in the die region and minimize the size of the die.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A wafer comprising:
a die region;
a scribe-line region adjacent to the die region of the wafer, the scribe-line region of the wafer comprising an open recess;
a conductive bonding pad in the die region of the wafer; and
a wafer acceptance test (WAT) pad disposed at least partially in the open recess of the scribe-line region of the wafer, a top surface of a portion of the WAT pad being positioned lower than a top surface of the conductive bonding pad, wherein a side portion of the WAT pad has a topmost surface positioned at substantially a same distance from a base of the wafer as a topmost surface of the conductive bonding pad.

2. The wafer of claim 1, wherein Hall the side portion of the WAT pad surrounds a bottom portion of the WAT pad, and wherein the top surface of the portion of the WAT pad is an upper surface of the bottom portion of the WAT pad.

3. The wafer of claim 1, wherein the topmost surface of the conductive bonding pad is at least partially exposed.

4. The wafer of claim 2, wherein the side portion of the WAT pad comprises an upper portion and a lower portion, and a width of the upper portion of the side portion of the WAT pad is greater than a width of the lower portion of the side portion of the WAT pad.

5. The wafer of claim 4, wherein the upper portion of the side portion of the WAT pad has a height substantially a same as a height of the conductive bonding pad.

6. The wafer of claim 5, wherein the height of the conductive bonding pad is in a range from 3 μm to 10 μm.

7. The wafer of claim 1, wherein the scribe-line region of the wafer has a test key in the scribe-line region of the wafer, and the WAT pad is located at the test key in the scribe-line region of the wafer.

8. The wafer of claim 1, further comprising an interconnect layer under the conductive bonding pad in the die region of the wafer.

9. The wafer of claim 8, wherein the interconnect layer comprises a metal layer, an intermetal dielectric (IMD) layer and a via.

10. The wafer of claim 8, wherein the interconnect layer in the die region of the wafer has a height in a range from 5 μm to 10 μm.

11. The wafer of claim 8, further comprising a first barrier layer between the interconnect layer and the conductive bonding pad.

12. The wafer of claim 11, further comprising a second barrier layer surrounding the WAT pad.

13. The wafer of claim 1, wherein the open recess of the scribe-line region of the wafer is positioned proximate an intended dicing line along the wafer in order to at least partially prevent cracks from propagating through the die region during a dicing process.

14. A wafer comprising:
a die region;
a scribe-line region adjacent to the die region of the wafer, the scribe-line region of the wafer comprising a recess;
a conductive bonding pad in the die region of the wafer; and
a wafer acceptance test (WAT) pad disposed at least partially in the recess of the scribe-line region of the wafer, and a top surface of a lower portion of the WAT pad is lower than a top surface of the conductive bonding pad, a side portion of the WAT pad having an uppermost surface that is positioned at substantially a same height above a base of the wafer as an uppermost surface of the conductive bonding pad.

15. The wafer of claim 14, wherein the at least partially open recess of the scribe-line region of the wafer is positioned proximate an intended dicing line along the wafer in order to at least partially prevent cracks from propagating through the die region of the wafer during a dicing process.

16. The wafer of claim 14, wherein the WAT pad is laterally separated from the conductive bonding pad.

17. A wafer comprising:
a die region of the wafer;
a scribe-line region adjacent to the die region;
a conductive bonding pad in the die region of the wafer; and
a wafer acceptance test (WAT) pad and a top surface of a portion of the WAT pad being positioned lower than a top surface of the conductive bonding pad, wherein a side portion of the WAT pad has an uppermost surface positioned at substantially a same distance from a base of the wafer as an uppermost surface of the conductive bonding pad.

18. The wafer of claim 17, wherein the scribe line region of the wafer comprises an open recess, and wherein the WAT pad disposed at least partially in the open recess of the scribe-line region of the wafer.

19. The wafer of claim 17, wherein the WAT pad is laterally separated from the conductive bonding pad.

\* \* \* \* \*

UNITED STATES PATENT AND TRADEMARK OFFICE
CERTIFICATE OF CORRECTION

PATENT NO. : 9,865,516 B2  
APPLICATION NO. : 14/992013  
DATED : January 9, 2018  
INVENTOR(S) : Tzung-Han Lee et al.

Page 1 of 1

It is certified that error appears in the above-identified patent and that said Letters Patent is hereby corrected as shown below:

In the Claims

| | | | |
|---|---|---|---|
| Claim 2, | Column 7, | Line 60, | change "wherein Hall the" to --wherein the-- |
| Claim 15, | Column 8, | Lines 47, 48, | change "wherein the at least partially open recess" to --wherein the recess-- |
| Claim 17, | Column 8, | Line 55, | change "a die region of the wafer;" to --a die region;-- |
| Claim 17, | Column 8, | Line 56, | change "adjacent to the die region;" to --adjacent to the die region of the wafer;-- |

Signed and Sealed this  
Twenty-ninth Day of May, 2018

Andrei Iancu  
*Director of the United States Patent and Trademark Office*